(12) United States Patent
Liang (10) Patent No.: US 11,388,534 B2
(45) Date of Patent: Jul. 12, 2022

(54) ELECTROACOUSTIC CONVERTOR, AUDIO DEVICE AND AUDIO METHOD THEREOF

(71) Applicant: xMEMS Labs, Inc., Santa Clara, CA (US)

(72) Inventor: Jemm Yue Liang, Sunnyvale, CA (US)

(73) Assignee: xMEMS Labs, Inc., Santa Clara, CA (US)

(*) Notice: Subject to any disclaimer, the term of this patent is extended or adjusted under 35 U.S.C. 154(b) by 156 days.

(21) Appl. No.: 16/932,824

(22) Filed: Jul. 19, 2020

(65) Prior Publication Data

US 2021/0105567 A1   Apr. 8, 2021

Related U.S. Application Data

(60) Provisional application No. 62/911,308, filed on Oct. 6, 2019, provisional application No. 62/910,862, filed on Oct. 4, 2019.

(51) Int. Cl.
| | | |
|---|---|---|
| *H04R 29/00* | (2006.01) | |
| *H04R 3/00* | (2006.01) | |
| *H04R 19/02* | (2006.01) | |
| *H03F 3/45* | (2006.01) | |

(52) U.S. Cl.
CPC ....... *H04R 29/001* (2013.01); *H03F 3/45475* (2013.01); *H04R 3/00* (2013.01); *H04R 19/02* (2013.01); *H03F 2200/03* (2013.01); *H04R 2400/11* (2013.01)

(58) Field of Classification Search
CPC ........ H04R 3/06; H04R 19/04; H04R 29/001; H04R 3/00; H04R 19/02; H04R 2400/11; H03F 3/45475; H03F 2200/03
USPC .......................................... 381/113, 116, 191
See application file for complete search history.

(56) References Cited

U.S. PATENT DOCUMENTS

| | | | |
|---|---|---|---|
| 8,385,586 B2 * | 2/2013 | Liou ...................... | H04R 19/00 381/431 |
| 2009/0060233 A1 | 3/2009 | Liou | |
| 2015/0125003 A1 | 5/2015 | Wiesbauer | |

* cited by examiner

*Primary Examiner* — David L Ton
(74) *Attorney, Agent, or Firm* — Winston Hsu (57) ABSTRACT

An audio device includes an electroacoustic convertor and a differential amplifier. The electroacoustic convertor has a first output terminal and a second output terminal. A first polarity of a first capacitance variation corresponding to the first output terminal is opposite to a second polarity of a second capacitance variation corresponding to the second output terminal. The first capacitance variation and the second capacitance variation are associated with a magnitude of acoustic pressure. The differential amplifier has a first input terminal coupled to the first output terminal and a second input terminal coupled to the second output terminal.

13 Claims, 7 Drawing Sheets

ELECTROACOUSTIC CONVERTOR, AUDIO DEVICE AND AUDIO METHOD THEREOF

CROSS REFERENCE TO RELATED APPLICATIONS

This application claims the benefit of U.S. provisional application No. 62/911,308, filed on Oct. 6, 2019, and U.S. provisional application No. 62/910,862, filed on Oct. 4, 2019, which are all incorporated herein by reference.

BACKGROUND OF THE INVENTION

1. Field of the Invention

The present invention relates to an electroacoustic convertor, an audio device and an audio method, and more particularly, to an electroacoustic convertor, an audio device and an audio method, which reduce the susceptibility to common mode noise during an acoustic signal to electrical signal conversion process.

2. Description of the Prior Art

During an acoustic signal to electrical signal conversion, minute sound pressure changes are converted to electrical signals of similarly faint level. Due to the very low signal level, these devices are susceptible to surrounding noise and signal quality are prone to contamination by the noise. Accordingly, efforts are being directed in developing innovative audio devices to guard against noise in different environments.

SUMMARY OF THE INVENTION

It is therefore a primary objective of the present invention to provide an electroacoustic convertor, an audio device and an audio method, which ensure superior sound quality when operating under noisy environments.

An embodiment of the present invention provides an audio device. The audio device includes an electroacoustic convertor and a differential amplifier. The electroacoustic convertor has a first output terminal and a second output terminal. A first polarity of a first capacitance variation corresponding to the first output terminal is opposite to a second polarity of a second capacitance variation corresponding to the second output terminal. The first capacitance variation and the second capacitance variation are associated with a magnitude of acoustic pressure. The differential amplifier has a first input terminal coupled to the first output terminal and a second input terminal coupled to the second output terminal.

Another embodiment of the present invention provides an audio method. The audio method for an audio device includes outputting a first signal corresponding to a first capacitance variation and outputting a second signal corresponding to a second capacitance variation, and amplifying a difference between the first signal and the second signal. A first polarity of the first capacitance variation is opposite to a second polarity of the second capacitance variation. The first capacitance variation and the second capacitance variation are associated with a magnitude of acoustic pressure.

Another embodiment of the present invention provides an electroacoustic convertor. The electroacoustic convertor includes an upper electrode, a lower electrode, and at least one spacer. The at least one spacer is configured to separate the upper electrode and the lower electrode. Each of the at least one spacer is disposed at a reentrant vertex or a tip vertex of the upper electrode. The upper electrode or a layer of the lower electrode has permanent electric charges.

These and other objectives of the present invention will no doubt become obvious to those of ordinary skill in the art after reading the following detailed description of the preferred embodiment that is illustrated in the various figures and drawings.

DETAILED DESCRIPTION

In the following description and claims, the terms "include" and "comprise" are used in an open-ended fashion, and thus should be interpreted to mean "include, but not limited to". Also, the term "couple" is intended to mean either an indirect or direct electrical connection. Use of ordinal terms such as "first" and "second" does not by itself connote any priority, precedence, or order of one element over another or the temporal order in which acts of a method are performed, but are used merely as labels to distinguish one element having a certain name from another element having the same name.

Figure 1:
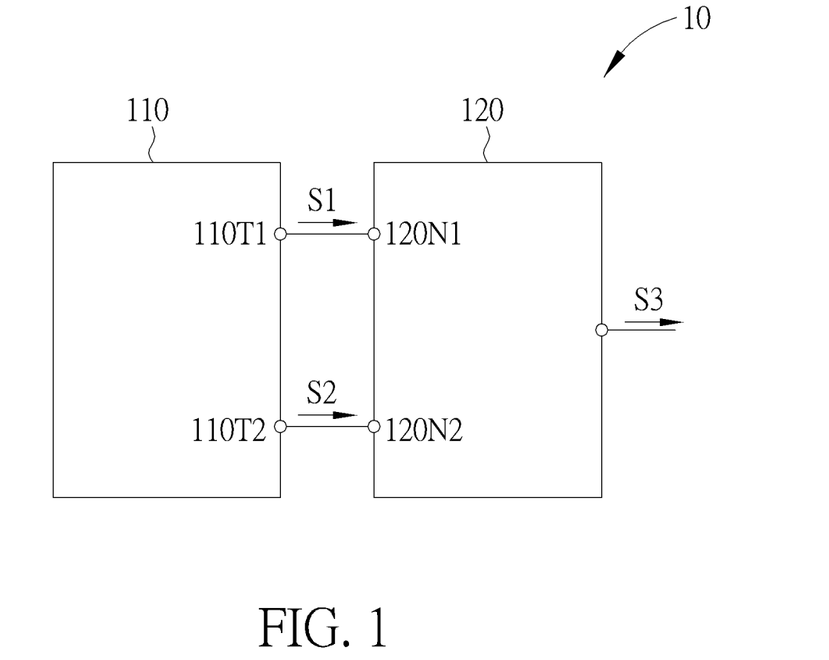
FIG. 1 is a schematic diagram of an audio device according to an embodiment of the present invention.

Please refer to FIG. 1. FIG. 1 is a schematic diagram of an audio device 10 according to an embodiment of the present invention. The audio device 10 may serve as a sound or pressure sensing apparatus or a microphone, but not limited thereto. The audio device 10 includes an electroacoustic convertor 110 and a differential amplifier 120. The electroacoustic convertor 110 configured to convert acoustic signals to electrical signals has output terminals 110T1 and 110T2. The differential amplifier 120 having input terminals 120N1 and 120N2 is configured to apply a gain to differences between electrical signals S1 and S2 at the input terminals 120N1 and 120N2 and to reject common mode components of the signals S1 and S2, thereby ensuring noise reduction. When acoustic pressure is applied to the electroacoustic convertor 110, signal S1 (also referred to as the first signal) corresponding to a first capacitance variation is output from output terminal 110T1 (also referred to as the first output terminal), which is coupled to the input terminal 120N1 (also referred to as the first input terminal), and signal S2 (also referred to as the second signal) corresponding to a second capacitance variation is output from output terminal 110T2 (also referred to as the second output terminal), which is coupled to the input terminal 120N2 (also referred to as the second input terminal). Both the first capacitance variation and the second capacitance variation are associated with the magnitude of the said acoustic pressure applied to the electroacoustic convertor 110. The polarity (also referred to as the first polarity) of the first capacitance variation is however opposite to the polarity (also referred to as the second polarity) of the second capacitance variation; therefore, signal S1 at output terminal 110T1 and signal S2 at output terminal 110T2 are also of opposite polarities.

Differential amplifier 120 is configured to convert the difference between differential signals S1 and S2 into a single-ended signal S3, while rejecting the common mode signals. In other words, audio device 10 has common mode rejection (CMR) capability to reject common mode noise during the acoustic-to-electric conversion process involving electroacoustic convertor 110 and differential amplifier 120.

Briefly, the relation between the magnitude of signal S1 and the magnitude of the acoustic pressure may be similar to the relation between the magnitude of signal S2 and the magnitude of the acoustic pressure; however, signal S1 corresponds to a first capacitance variation with a reverse polarity of a second capacitance variation corresponding to signal S2. Thus, signals S1 and S2 form a pair of differential signals. The output signal S3 of the differential amplifier 120 is ideally proportional to the difference between the signals S1 and S2.

Figure 2:
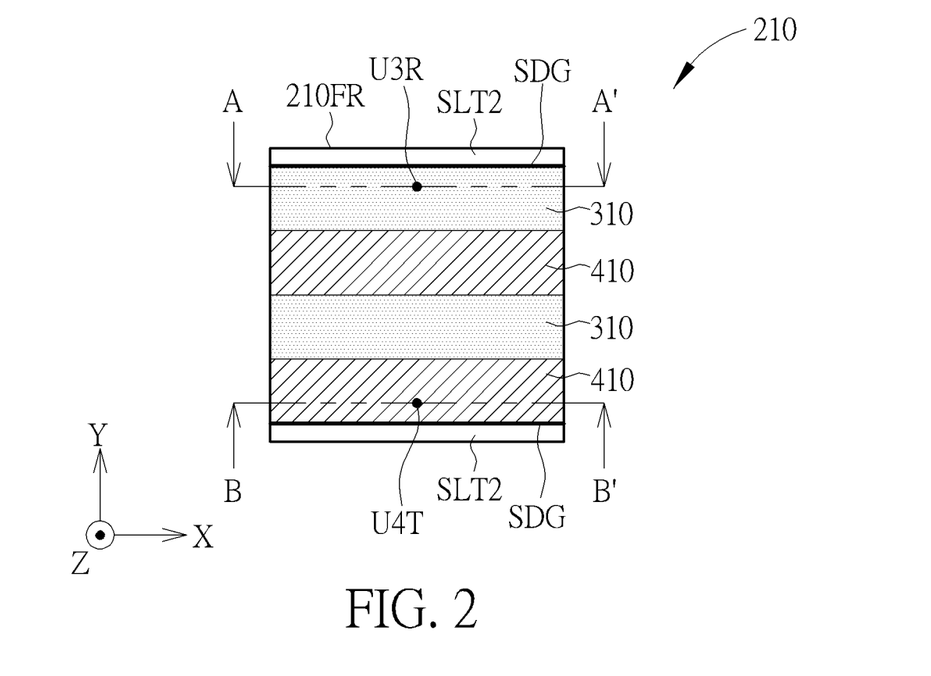
FIG. 2 is a schematic diagram illustrating a top view of an electroacoustic convertor according to embodiments of the present invention.
Figure 3:
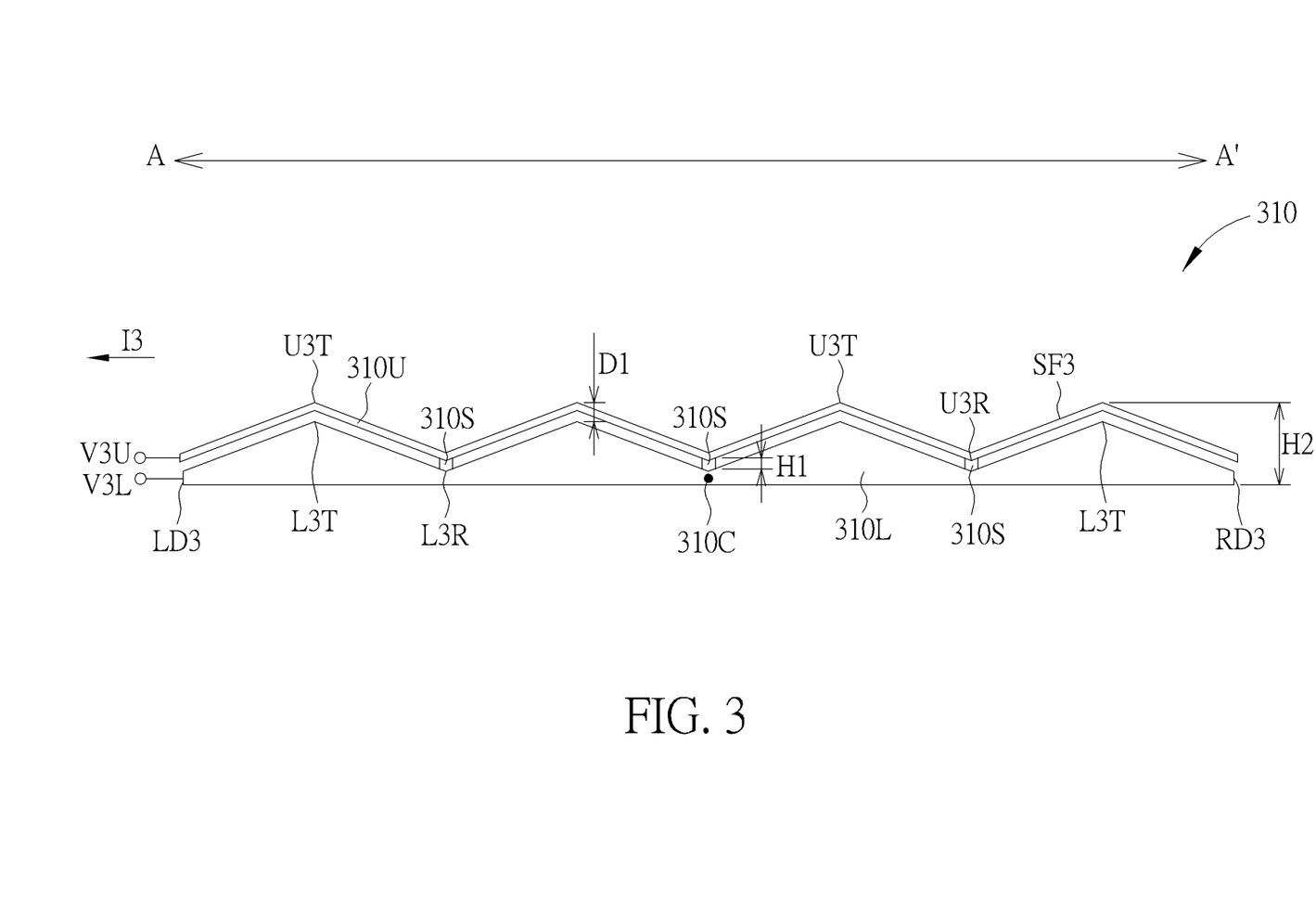
FIG. 3 is a cross-sectional view taken along a cross-sectional line in FIG. 2.
Figure 4:
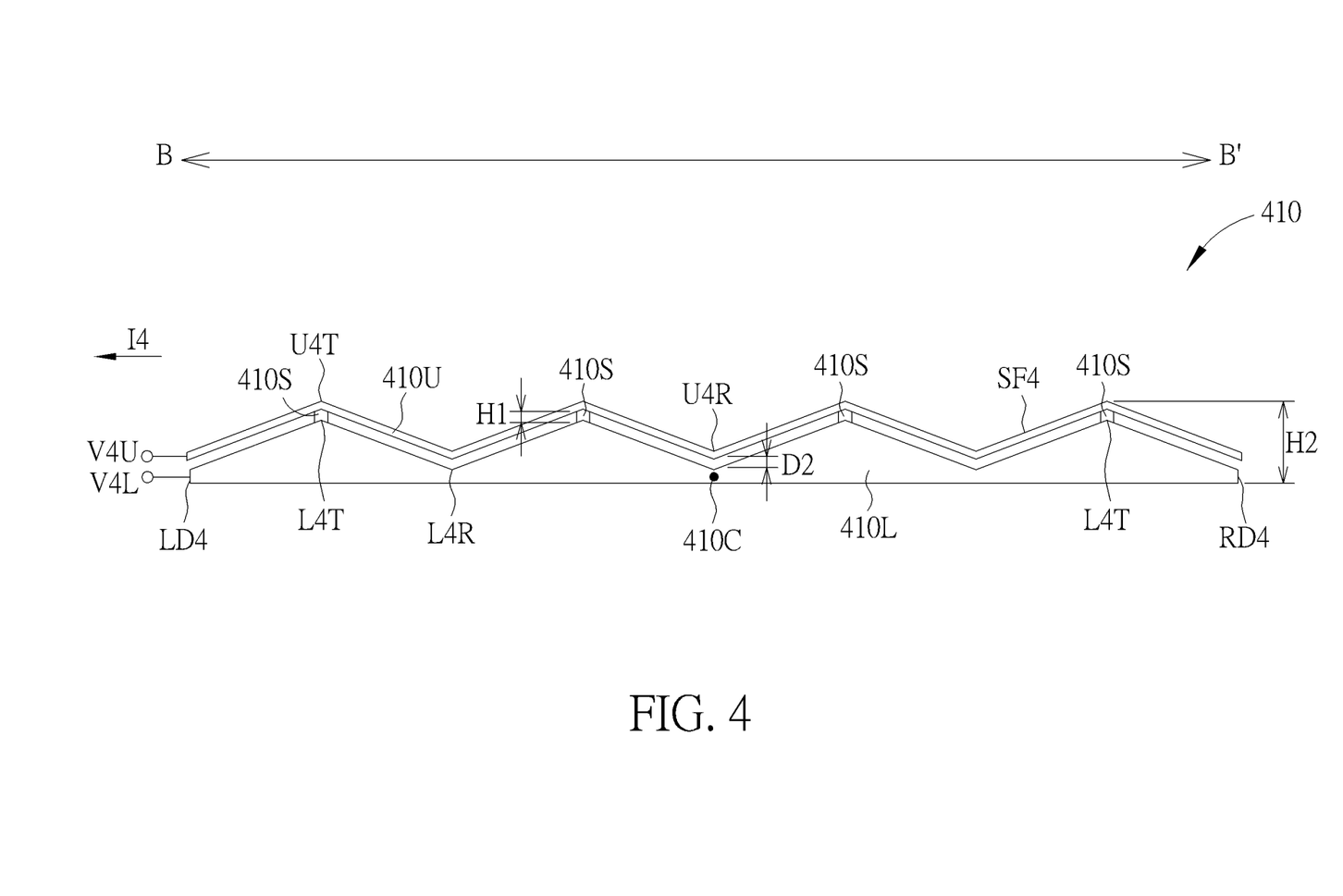
FIG. 4 is a cross-sectional view taken along a cross-sectional line in FIG. 2.

Specifically, please refer to FIG. 2 to FIG. 4. FIG. 2 is a schematic diagram illustrating a top view of an electroacoustic convertor 210 according to embodiments of the present invention where electroacoustic convertor 210 comprises an acoustic pressure sensing membrane made up of at least one capacitive sensing membrane 310 and at least one capacitive sensing membrane 410. FIG. 3 is a cross-sectional view of sensing membrane 310 taken along cross-sectional line A-A' in FIG. 2. FIG. 4 is a cross-sectional view of sensing membrane 410 taken along cross-sectional line B-B' in FIG. 2. Electroacoustic convertor 210 shown in FIG. 2 may serve as the electroacoustic convertor 110 shown in FIG. 1.

In some embodiments, the electroacoustic convertor 210 may include a plurality of sensing membranes 310 and equal number of sensing membranes 410, each having same sensing area and abutting each other. In FIG. 2, there are two sensing membranes 310 and two sensing membranes 410; nevertheless, the number and the arrangements of the sensing membranes 310 and 410 (serving as sensing capacitors) may vary according different system design objectives.

As shown in FIG. 3, capacitive sensing membrane 310 (also referred to as the first sensing capacitor) may include a plurality of spacers 310S (also referred to as the first spacers), an upper electrode 310U (also referred to as the first upper electrode) and a lower electrode 310L (also referred to as the first lower electrode).

The upper electrode 310U comprises a thin membrane, typically 0.2-1 micrometers (μm) in thickness, having a cross-section profile of sawtooth contour as illustrated in FIG. 3. The lower electrode 310L comprises a plate with a sawtooth profiled top surface, facing upper electrode 310U, and a flat bottom surface; furthermore, as illustrated in FIG. 3, the contour of the top surface of lower electrode 310L matches the contour of upper electrode 310U. Electrodes 310L and 310U are separated from each other and bounded to each other by spacers 310S, such that, during the neutral state of sensing membrane 310, the spacing between electrodes 310U and 310L approximately equals the height H1 of spacers 310S which may be 100-400 nanometers (nm), but not limited thereto. Sensing membrane 310 is anchored to the frame 210FR of electroacoustic convertor 210 at the left edge LD3 and the right edge RD3 of membrane 310 respectively.

As shown in FIG. 3, spacers 310S are disposed at reentrant vertexes U3R (also referred to as the first reentrant vertexes) of the upper electrode 310U and reentrant vertexes L3R of the lower electrode 310L to electrically insulate the upper electrode 310U from the lower electrode 310L. A tip vertex U3T (also referred to as the first tip vertex) of the upper electrode 310U and a tip vertex L3T of the lower electrode 310L may be spaced apart by a distance D1 (also referred to as the first distance) which substantially equals the height H1 of spacers 310S during the neutral state of sensing membrane 310. Upon impingement of acoustic pressure waves, the surface of sensing membrane 310 deforms. That is, the center 310C of membrane 310 moves up or down relative to left edge LD3 and right edge RD3 according to impinging pressure and such deformation of membrane 310 causes distance D1 to change, which lead to the first capacitance variation associated with the distance D1 between the upper electrode 310U and the lower electrode 310L. The upper electrode 310U and the lower electrode 310L are attached to terminals V3U and V3L. Either terminal V3U or V3L may serve as the output terminal 110T1.

Similarly, as shown in FIG. 4, capacitive sensing membrane 410 (also referred to as the second sensing capacitor) may include a plurality of spacers 410S (also referred to as the second spacers), an upper electrode 410U (also referred to as the second upper electrode) and a lower electrode 410L (also referred to as the second lower electrode). In some embodiments, materials of the spacers 410S, the upper electrode and the lower electrode may be silicon or composite, but not limited thereto.

The construction of upper electrode 410U, the lower electrode 410L and the spacers 410S are the same as that of upper electrode 310U, lower electrode 310L and spacers 310S; therefore, their description will be omitted for brevity. Different from the construction of membrane 310, spacers 410S of membrane 410, as shown in FIG. 4, are disposed at tip vertexes U4T (also referred to as the second tip vertexes) of the upper electrode 410U and tip vertexes L4T of the lower electrode 410L. As a result, a reentrant vertex U4R (also referred to as the second reentrant vertex) of the upper electrode 410U and a reentrant vertex L4R of the lower electrode 410L may be spaced apart by a distance D2 (also referred to as the second distance) which substantially equals the height H1 of spacers 410S during the neutral state of composite membrane 410.

Upon impingement of acoustic pressure waves, the surface of membrane 410 will deform accordingly and such deformation of membrane 410 causes the distance D2 to change, which lead to the second capacitance variation associated with the distance D2 between the upper electrode 410U and the lower electrode 410L. The upper electrode 410U and the lower electrode 410L are attached to terminals V4U and V4L. Either the terminal V4U or V4L serves as the output terminal 110T2.

Refer to cross-sectional structure of membrane 310 (or 410), where the upper electrode 310U (or 410U) has a sawtooth cross-section profile along the direction of A-A' (or B-B') while the lower electrode 310L (or 410L) has a cross-section profile matching upper electrode 310U on the side facing upper electrode 310U and a flat surface on the other side. Due to the difference of the cross-sectional profile, in particular the flat surface side, lower electrode 310L (or 410L) is much stronger than upper electrode 310U (or 410U) against compressive and tensile force along the direction of A-A' (or B-B').

Upon the impingement of acoustic pressure wave, sensing membrane 310 (or 410), comprising upper electrode 310U (or 410U), lower electrode 310L (or 410L) and spacers 310S (or 410S), will deform concavely or convexly as one unit. Due to the much higher relative strength of lower electrode 310L (or 410L) along the direction of A-A' (or B-B'), when composite membrane 310 (or 410) bends concavely or convexly, defined as center 310C (or 410C) moving down or up relative to its two anchored sides (left edge LD3 and right edge RD3, or left edge LD4 and right edge RD4), the weaker upper electrode 310U (or 410U) will experience more deformation in response to either the compressing or the tensile force as a result of the deformation of membrane 310 (or 410) which cause upper electrode 310U (or 410U) to concave or convex more than the bottom electrode 310L (or 410L) and therefore cause the inter-electrode spacing, namely, distance D1 (or D2), to change according to the acoustic pressure impinging upon structure of membrane 310 (or 410).

By placing spacers 310S at reentrant vertexes of lower electrode 310L as shown in FIG. 3, while placing spacers 410S at tipping vertexes of lower electrode 410L as shown in FIG. 4, the changes of distances D1 and D2 due to the impingement of the same sound pressure upon membrane 310 and membrane 410 will be of substantially the same magnitude but opposite signs, that is, the changes of distances D1 and D2 will be differential, or, balanced.

Since the capacitance C of parallel-plate-capacitor is related to the distance D between the plates (namely, $$C = \frac{k \cdot A}{D}),$$

when distances D1 and D2 change, the capacitance between terminals V3U and V3L and between terminals V4U and V4L also change accordingly. Therefore, when acoustic pressure wave impinges upon sensing membranes 310 and 410, the capacitance between terminals V3U and V3L and the capacitance between terminals V4U and V4L also change in a differential manner.

The parallel-plate capacitor construction of electroacoustic converter 210 is a type of condenser microphone. The operation of a condenser microphone requires an electric field (E-field) to be established between the plates of the sensing capacitor. This E-field can be established either explicitly by a low-noise, bias voltage source or implicitly by impregnating one of the plate electrodes with permanent charges. When such an E-field is established, for example by a voltage source V across terminals V3U and V3L, electrical charge Q=C·V will be established across membranes 310U and 310L. Since voltage V is a constant, altering the quantity of charge Q will change capacitance C. Therefore, when distance D1 changes, the quantity of electrical charge Q stored between membranes 310U and 310L changes accordingly and such changing charge Q leads to current I3 flowing between terminals V3U and V3L. Similarly, when distance D2 changes, the amount of charge Q stored between membranes 410U and 410L changes accordingly and such changing charge Q leads to current I4 flowing between terminals V4U and V4L. Due to the balanced nature of changes in distances D1 and D2, current I3 and current I4 will also be balanced.

Figure 8:
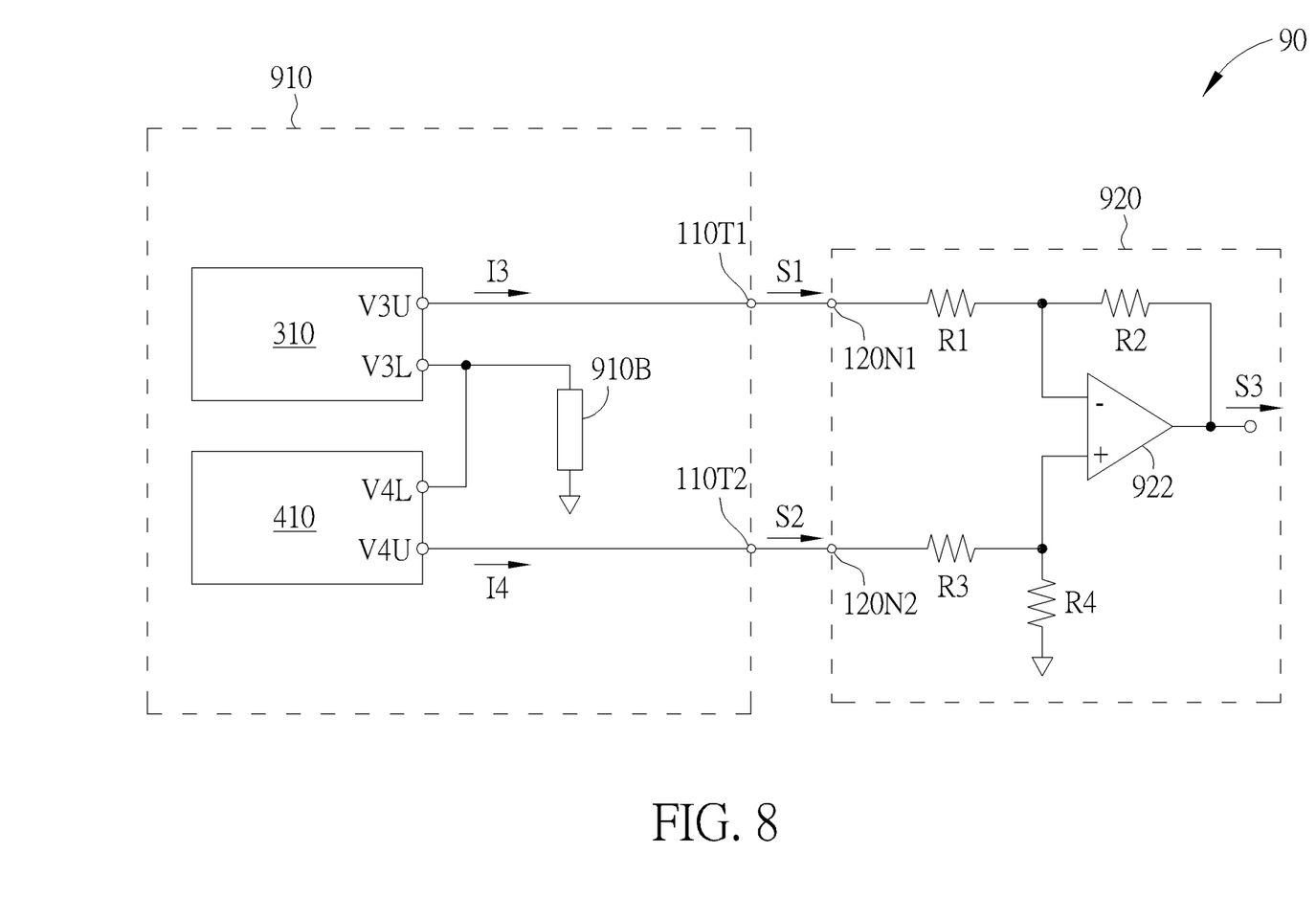
FIG. 8 is a schematic diagram of another audio device according to an embodiment of the present invention.

The balanced current pair I3 and I4 can be converted directly into single ended signal S3 utilizing a differential amplification scheme such as the circuit shown in FIG. 8. However, the capacitor-and-resistor (C-R) configuration of the circuit in FIG. 8 means its signal-to-noise (S/N) ratio will drop as frequency goes lower. Therefore, as an alternative, a current integration stage is utilized in FIG. 9, to first convert the current signals (namely, currents I3 and I4) into voltage signals respectively, before converting the pair of differential voltage signals into single end voltage signal.

Figure 9:
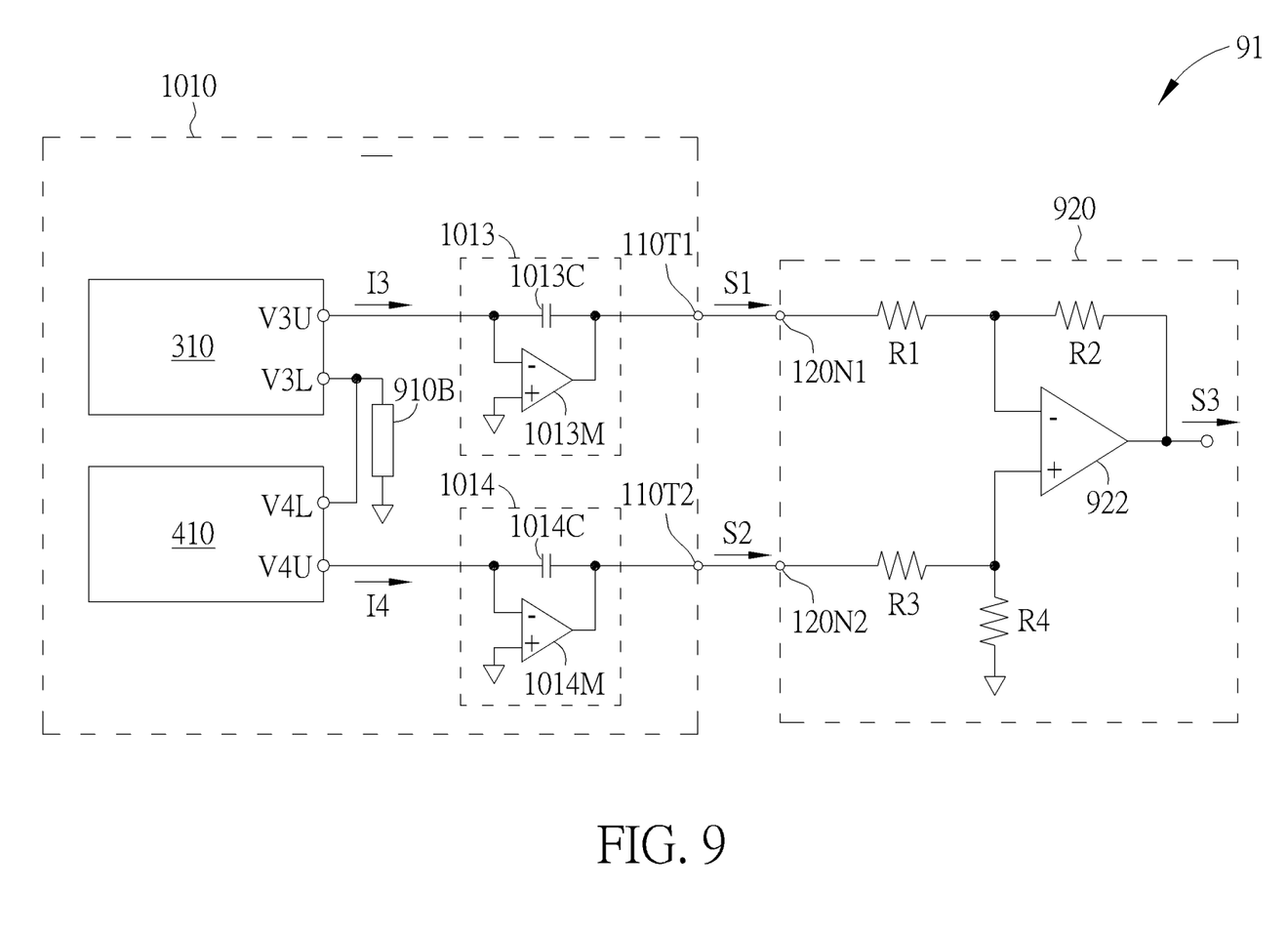
FIG. 9 is a schematic diagram of another audio device according to an embodiment of the present invention.

With either embodiment of FIG. 8 or FIG. 9, balanced signals S1 and S2 are converted into single end signal S3 by a differential amplifier which will enhance signal symmetry, reduce even-order distortion and, most important of all, suppress common mode noise components of signals S1 and S2 and hence ensure high signal-to-noise ratio.

Except the placement difference between the spacers 310S and 410S, the structure of sensing membrane 310 is the same as that of the sensing membrane 410. As viewed along the z-axis, each of the spacers 310S at the reentrant vertexes U3R and L3R is interleaved with the spacers 410S at the tip vertexes U4T and L4T. For the ease of manufacture, in some embodiments, there is uniformity between the sensing membranes 310 and 410 viewed from side. In some embodiments, portions of the upper electrode 310U (or the lower electrode 310L) are coplanar with portions of the upper electrode 410U (or the lower electrode 410L) respectively to reduce manufacture complexity. For example, a surface SF3 of the upper electrode 310U is coplanar with a surface SF4 of the upper electrode 410U.

In some embodiments, martials of the spacers 310S, 410S, the upper electrode 310U, 410U and the lower electrode 310L, 410L may be silicon or composite thereof, but not limited thereto. In some embodiments, the edges of electrode 310U, 410U, 310L, 410L of electroacoustic convertor 210 may be treated with chemicals along a frame 210FR (thick solid line) to improve their resistance to water, humidity and dust. For instance, the electroacoustic convertor 210 may be sealed along its edges SDG to extend service life.

The cross section profile of the upper electrode 310U, 410U and the lower electrode 310L, 410L may have shapes other than the sawtooth pattern illustrated in FIG. 3 and FIG. 4 as long as the profile of upper electrode matches the profile of the opposing surface of lower electrode, so as to form a parallel plate capacitor between the upper electrode and the lower electrode.

In some embodiments, (the upper electrodes 310U and 410U of) the sensing membranes 310 and 410 viewed from top may be alternately disposed. In some embodiments, (the upper electrodes 310U and 410U of) the sensing membranes 310 and 410 viewed from top may be disposed with regularity and symmetry. That is to say, the area or shape (of one upper electrode 310U) of one sensing membrane 310 may be substantially the same as the area or shape (of one upper electrode 410U) of one sensing membrane 410.

For example, as shown in FIG. 2, (the upper electrodes 310U and 410U of) the sensing membranes 310 and 410 viewed from top may be alternately disposed. In FIG. 2, the electroacoustic convertor 210 has two slits SLT2 to separate the frame 210FR, the sensing membranes 310 or 410. Each of the slits SLT2 viewed from top has a shape of a rectangle. For the best low frequency response, the width of slits SLT2 should be 1 um or smaller. In an embodiment, the exposed edges of membranes 310 and 410 may be treated to improve resistance to water, dust and humidity. In some embodiments, left sides LD3, LD4 and right sides RD3, RD4 of the sensing membranes 310 and 410 are anchored to the frame 210FR of the electroacoustic convertor 210. In FIG. 2, all the sensing membranes 310 and 410 may be formed in one piece.

Figure 5:
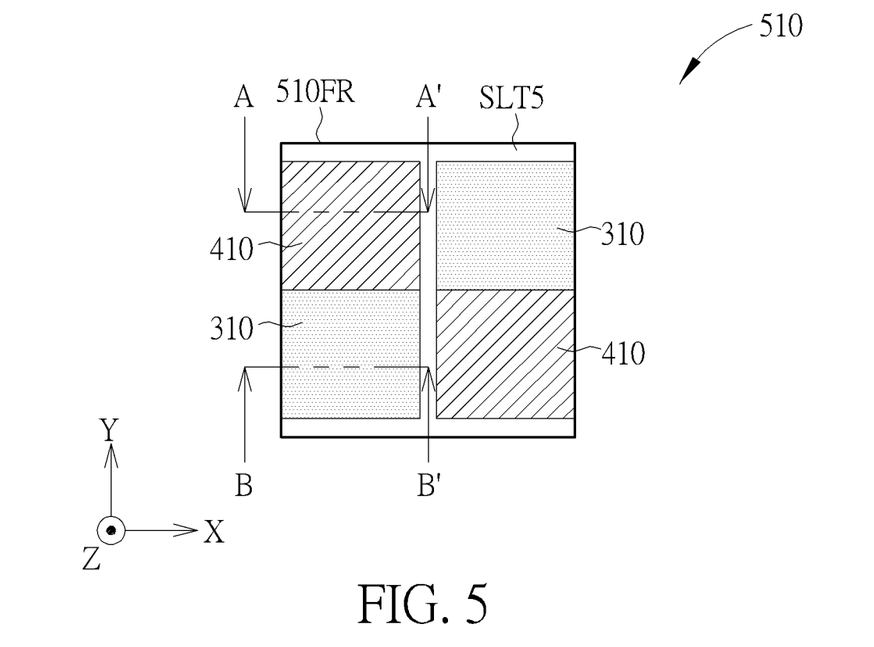
FIG. 5 is a schematic diagram illustrating a top view of another electroacoustic convertor according to embodiments of the present invention.

It is noteworthy that the electroacoustic convertor 210 shown in FIG. 2 is an exemplary embodiment of the present invention, and those skilled in the art may readily make different alternations and modifications. For example, please refer to FIG. 5. FIG. 5 is a schematic diagram illustrating a top view of an electroacoustic convertor 510 according to embodiments of the present invention, wherein a cross-sectional view taken along a cross-sectional line A-A' and a cross-sectional view taken along a cross-sectional line B-B' are shown in FIG. 3 and FIG. 4 respectively. Distinct from the electroacoustic convertor 210, the electroacoustic convertor 510 has a slit pattern SLT5 shaped like a rotated (or transverse) capital letter "H" to represent edges where the frame 510FR of the electroacoustic convertor 510 is separated from the edges of sensing membranes 310, 410. In other words, only the left side LD3 (or LD4) and the right side RD3 (or RD4) of the sensing membrane 310 (or 410) is anchored to the frame 510FR, while the other side of the sensing membrane 310 (or 410) is unfixed or loosened due to slit SLT5. With one side being free, sensing membranes 310 and 410 of electroacoustic convertor 510 have more freedom of movement than the corresponding 2-side-anchored sensing membranes in electroacoustic convertor 210, resulting in increased membrane deformation upon impingement of sound pressure which leads to increased changes of distances D1 and D2, and thusly improves the sensitivity to acoustic pressure.

In summary, by changing from 2-side-anchored structure of electroacoustic convertor 210 to 1-side-anchored structure of electroacoustic convertor 510, sensing membranes 310 and 410 can vibrate more freely, have larger displacement, produce higher current flow I3 and I4, which result in stronger signals S1, S2 at the terminals 120N1, 120N2.

In FIG. 5, which is a view from the top, both on the left side and the right side of electroacoustic convertor 510, (the upper electrodes 310U and 410U of) sensing membrane 310 and 410 are alternately disposed, abutting each other, and formed as one coplanar piece.

Figure 6:
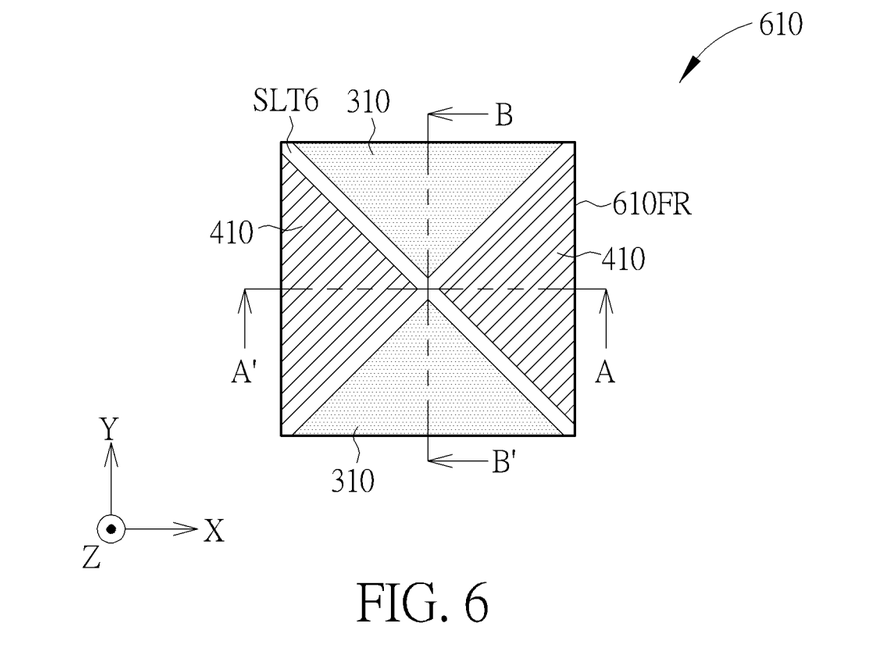
FIG. 6 is a schematic diagram illustrating a top view of another electroacoustic convertor according to embodiments of the present invention.

FIG. 6 is a top view of electroacoustic convertor 610 which is another embodiment according to the present invention, wherein a cross-sectional view taken along a cross-sectional line A-A' and a cross-sectional view taken along a cross-sectional line B-B' are shown in FIG. 3 and FIG. 4 respectively. In electroacoustic convertor 610 of FIG. 6, (the upper electrodes 310U and 410U of) the sensing membranes 310 and 410 are of triangle shape and are diagonally arranged. In addition, (the upper electrodes 310U and 410U of) sensing membranes 310 and 410 viewed from top may be alternately disposed with a slit pattern SLT6 shaped like the capital letter "X" separating these four alternating sensing membranes from one another as shown in FIG. 6.

One of the left side LD3 (or LD4) or the right side RD3 (or RD4) of the sensing membrane 310 (or 410) is anchored to the frame 610FR, but the opposite side of the sensing membrane 310 (or 410) is unfixed or free to move because of the (X-shaped) slit SLT6. Similar to the case of electroacoustic convertor 510, sensing membranes 310 and 410 of electroacoustic convertor 610 will also be able to vibrate more freely than electroacoustic convertor 210. Moreover, the stiffness of triangular shaped sensing membranes will be lower than rectangular shaped sensing membranes, allowing electroacoustic convertor 610 to have larger displacement, produce higher current flow I3 and I4 than electroacoustic convertor 510.

In some embodiments, in order to establish the required E-field required for the operation of the condenser microphone, dielectric materials (such as electret) with permanent electric charges or dipole polarization may be introduced into upper electrode or lower electrode of sensing membrane 310 and 410. For example, the upper electrode of the upper electrode 310U or 410U may have permanent electric charges or dipole polarization, which will produce a static electric field between upper electrode 310U or 410U and lower electrode 310L or 410L and, therefore, avoid the need for the low-noise bias voltage source.

Figure 7:
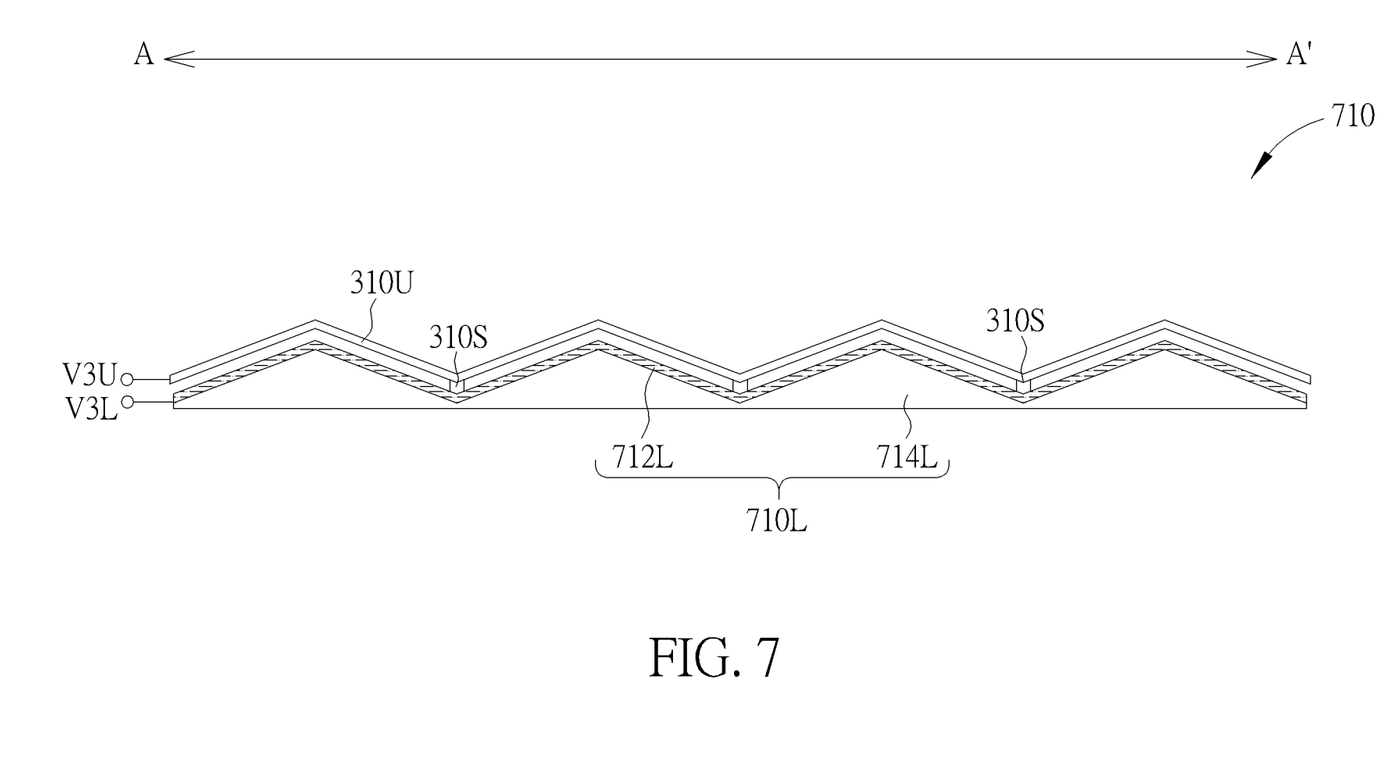
FIG. 7 is a cross-sectional view taken along a cross-sectional line in FIG. 2.

Refer to FIG. 7, which may be a cross-sectional view taken along a cross-sectional line A-A' in FIG. 2, FIG. 5, or FIG. 6. A sensing membrane 710 shown in FIG. 7 corresponds to the sensing membrane 310 shown in FIG. 3. Distinct from the sensing membrane 310, lower electrode 710L of the sensing membrane 710 further comprises a permanently charged layer 712L, wherein the electrical charge imbued within layer 712L establishes a dipole polarization between upper electrode 310U and plate 712L and therefore abolish the need for an explicit bias voltage source.

In some embodiments, the layer 712L is made of dielectric materials (such as electret). In some embodiments, the lower electrode 710L may be fabricated by semiconductor manufacturing processes or microelectromechanical system (MEMS) manufacturing processes. For example, ion implantation process may be employed to implant charged ions into a previously charge-neutral layer 712L which situates on top of substrate 714L of the lower electrode 710L. In another example, a chemical vapor deposition (CVD) or sputtering process may be employed to deposit an electrically charged layer on top of layer 712L.

To maintain the charges within layer 712L, substrate 714L and the spacers 310S may be made of highly insulating materials. Alternatively, in some embodiment, barrier layers may be created at the interface of layer 712L and substrate 714L and the interface of layer 712L and spacers 310S such that charges within layer 712L are repelled from the vicinity of barrier layers.

Similarly, by altering the placement of spacers 310S in FIG. 7 to the placements of spacers 410S in FIG. 4, sensing membrane 710 will become the cross-sectional view corresponding to cross-sectional line B-B' in FIG. 2, FIG. 5, or FIG. 6 and such sensing membranes can replace sensing membranes 410 while abolish the need for bias voltage source.

Please refer to FIG. 8. FIG. 8 is a schematic diagram according to an embodiment of the present invention, where audio device 90 corresponds to audio device 10 of FIG. 1, electroacoustic convertor 910 corresponds to electroacoustic convertor 110 of FIG. 1 and differential amplifier 920 corresponds to differential amplifier 120 of FIG. 1.

The electroacoustic convertor 910 may include sensing membranes 310, 410 and a common bias voltage source 910B, connected to terminals V3L, V4L. Bias voltage source 910B may be omitted if sensing membranes 310 and 410 are self-polarized as sensing membrane 710 in FIG. 7 or any other suitably self-polarized sensing capacitors.

The bias voltage source 910B is configured to bias sensing membranes 310 and 410 with a constant voltage. In some embodiments, voltage source 910B may be a battery or other low-noise, stable voltage source. The capacitance of the sensing membrane 310 (or 410) is governed by the spacing between upper electrode 310U (or 410U) and lower electrode 310L (or 410L). With the presence of suitable bias voltage, when the capacitance of sensing membrane 310 (or 410) changes in response to the changes in upper-lower electrode distance D1 (or D2), the electrical charge Q between upper electrode 310U (or 410U) and lower electrode 310L (or 410L) also changes accordingly. Such changes in electrical charge Q gives rise to electric currents flowing through terminal 110T1 (or 110T2), where the rate of current flow reflects the rate of the electrical charge changes.

Note that, due to the placement of spacer 310S and 410S, the current produced by sensing membranes 310 and 410 will be similar in magnitude but opposite in direction, i.e. the currents produced by terminal V3U of sensing membrane 310 and terminal V4U of sensing membrane 410 form a pair of balanced current signal. As a result, the surface curvature changes upon the impingement of acoustic pressure are transformed into a pair of differential current signals I3 and I4 at terminals 110T1 and 110T2.

In one embodiment as illustrated in FIG. 8, this pair of differential current signals I3 and I4, which correspond to signals S1 and S2, are transmitted to terminals 120N1 and 120N2 of differential amplifier 920 respectively where the differential signal pair S1, S2 is converted to single-ended signal S3.

Note that current I3 (or I4) reflects the rate of the capacitance changes, $$I \propto \frac{dQ}{dt} = \frac{dC \cdot V}{dt} \propto \frac{dC}{dt} = \propto \frac{d\left(\frac{k \cdot A}{D}\right)}{dt} \propto \frac{-dD}{dt} \propto \frac{d\sin(f \cdot t)}{dt} \propto f \cdot \cos(f \cdot t).$$

This means the amplitude of signal I3, I4 will decay as the frequency of sound goes lower. To circumvent such a shortcoming, FIG. 9 employs two current integrators 1013 and 1014 to neutralize the time differential in the equation above, and convert the differential current signal pair I3, I4 into differential voltage signal pair S1, S2 before signals S1, S2 are converted to single-ended signal S3 by differential amplifier 920.

Current integrators 1013, 1014 in FIG. 9 only show the skeleton of current integrators. Proper optimizations may be added according to the characteristics of amplifiers 1013M and 1014M. Briefly, to function properly as a current integrator, amplifier 1013M (or 1014M) should have high input-impedance, high open-loop gain, low input-offset, low input-capacitance, and low-noise.

To sum up, since the placement of the first spacers of the first sensing capacitor is different from the placement of the second spacers of the second sensing capacitor, the distance between the first upper electrode and the first lower electrode of the first sensing capacitor may change oppositely to the second distance between the second upper electrode and the second lower electrode of the second sensing capacitor when the same acoustic pressure is applied to both the first sensing capacitor and the second sensing capacitor. This leads to the polarity of the first capacitance variation of the first sensing capacitor opposite to the polarity of the second capacitance variation of the second sensing capacitor, while the first capacitance variation and the second capacitance variation are associated with a magnitude of the acoustic pressure. The difference between the first signal corresponding to the first capacitance variation and the second signal corresponding to the second capacitance variation is subsequently amplified by the differential amplifier, thereby, suppressing the common mode noise, ensuring superior sound quality. The first sensing capacitor and the second sensing capacitor may be disposed with regularity and symmetry so as to reduce manufacture difficulty. The edge of electroacoustic convertor may be treated to enhance resistance to water, humidity and dust.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An audio device, comprising:
   an electroacoustic convertor, having a first output terminal and a second output terminal, wherein a first polarity of a first capacitance variation corresponding to the first output terminal is opposite to a second polarity of a second capacitance variation corresponding to the second output terminal, wherein the first capacitance variation and the second capacitance variation are associated with a magnitude of acoustic pressure, wherein the electroacoustic convertor comprises:
   at least one first sensing capacitor, wherein each of the at least one first sensing capacitor comprises:
     a first upper electrode;
     a first lower electrode, wherein the first capacitance variation is associated with a first distance between the first upper electrode and the first lower electrode; and
     at least one first spacer, configured to separate the first upper electrode and the first lower electrode; and
   at least one second sensing capacitor, wherein each of the at least one second sensing capacitor comprises:
     a second upper electrode, wherein a first tip vertex of the first upper electrode is aligned to a second tip vertex of the second upper electrode;
     a second lower electrode, wherein the second capacitance variation is associated with a second distance between the second upper electrode and the second lower electrode; and
     at least one second spacer, configured to separate the second upper electrode and the second lower electrode; and
   a differential amplifier, having a first input terminal coupled to the first output terminal and a second input terminal coupled to the second output terminal.

2. The audio device of claim 1, wherein each of the at least one first spacer is disposed at a first reentrant vertex of the first upper electrode, wherein each of the at least one second spacer is disposed at a second tip vertex of the second upper electrode.

3. The audio device of claim 1, wherein portions of the first upper electrode are coplanar with portions of the second upper electrode respectively.

4. The audio device of claim 1, wherein the first distance decreases and the second distance increases when a first acoustic pressure is applied to the at least one first sensing capacitor and the at least one second sensing capacitor.

5. The audio device of claim 1, wherein the first upper electrode, the second upper electrode, a layer of the first lower electrode, or a layer of the second lower electrode has permanent electric charges.

6. The audio device of claim 1, wherein the first capacitance variation and the second capacitance variation are caused by deformation of the at least one first sensing capacitor and the at least one second sensing capacitor due to acoustic pressure respectively.

7. The audio device of claim 1, wherein an area or shape of the first upper electrode of the electroacoustic convertor is identical to an area or shape of the second upper electrode of the electroacoustic convertor.

8. The audio device of claim 1, wherein the first upper electrode of the electroacoustic convertor and the second upper electrode of the electroacoustic convertor are alternately disposed.

9. The audio device of claim 1, wherein the first upper electrode of the electroacoustic convertor and the second upper electrode of the electroacoustic convertor are of triangle shape and are diagonally arranged.

10. The audio device of claim 1, wherein at least one side of the at least one first sensing capacitor is anchored to a frame of the electroacoustic convertor, wherein at least one side of the at least one second sensing capacitor is anchored to the frame.

11. An electroacoustic convertor, comprising:
an upper electrode;
a lower electrode; and
at least one spacer, configured to separate the upper electrode and the lower electrode, wherein each of the at least one spacer is disposed at a reentrant vertex or a tip vertex of the upper electrode, wherein the upper electrode, or a layer of the lower electrode has permanent electric charges.

12. The electroacoustic convertor of claim 11, wherein a distance between the upper electrode and the lower electrode decreases when a first acoustic pressure is applied to the electroacoustic convertor, wherein the distance increases when a second acoustic pressure is applied to the electroacoustic convertor.

13. An audio device, comprising:
an electroacoustic convertor, having a first output terminal and a second output terminal, wherein a first polarity of a first capacitance variation corresponding to the first output terminal is opposite to a second polarity of a second capacitance variation corresponding to the second output terminal, wherein the first capacitance variation and the second capacitance variation are associated with a magnitude of acoustic pressure, wherein the electroacoustic convertor comprises:
at least one first sensing capacitor, wherein each of the at least one first sensing capacitor comprises:
a first upper electrode;
a first lower electrode, wherein the first capacitance variation is associated with a first distance between the first upper electrode and the first lower electrode; and
at least one first spacer, configured to separate the first upper electrode and the first lower electrode, wherein each of the at least one first spacer is disposed at a first reentrant vertex of the first upper electrode; and
at least one second sensing capacitor, wherein each of the at least one second sensing capacitor comprises:
a second upper electrode;
a second lower electrode, wherein the second capacitance variation is associated with a second distance between the second upper electrode and the second lower electrode; and
at least one second spacer, configured to separate the second upper electrode and the second lower electrode, wherein each of the at least one second spacer is disposed at a second tip vertex of the second upper electrode; and
a differential amplifier, having a first input terminal coupled to the first output terminal and a second input terminal coupled to the second output terminal.

\* \* \* \* \*